(12) United States Patent
Matsuo (10) Patent No.: US 7,990,753 B2
(45) Date of Patent: Aug. 2, 2011

(54) SEMICONDUCTOR MEMORY DEVICE (75) Inventor: Ryosuke Matsuo, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 165 days.

(21) Appl. No.: 12/537,628

(22) Filed: Aug. 7, 2009

(65) Prior Publication Data
US 2010/0034012 A1 Feb. 11, 2010

(30) Foreign Application Priority Data

Aug. 8, 2008 (JP) ................. 2008-205102

(51) Int. Cl.
G11C 11/00 (2006.01)

(52) U.S. Cl. ............... 365/148; 365/189.11; 365/203

(58) Field of Classification Search .......... 365/148, 365/189.11, 203
See application file for complete search history.

(56) References Cited

U.S. PATENT DOCUMENTS

| 4,800,530 | A | 1/1989 | Itoh et al. | |
| 2007/0195582 | A1* | 8/2007 | Sakata et al. | 365/148 |
| 2009/0262568 | A1* | 10/2009 | Ono et al. | 365/148 |

* cited by examiner

Primary Examiner — Hoai V Ho
(74) Attorney, Agent, or Firm — Oblon, Spivak, McClelland, Maier & Neustadt, L.L.P.

(57) ABSTRACT

A nonvolatile semiconductor memory device having a plurality of unit cell arrays having memory cells each containing a first wiring and a second wiring intersecting each other, and a variable resistive element arranged at each intersection of said first wiring and said second wiring and electrically rewritable to nonvolatilely store a resistance value as data, characterized by comprising: a control circuit for applying a predetermined voltage to said memory cell in selectively accessing said memory cell; wherein said control circuit accumulates a predetermined electric charge in a parasitic capacitance of said memory cell included in a first unit cell array that is said specific unit cell array and not accessed at the first time, while on the other hand, accumulates a predetermined electric charge in a parasitic capacitance of said memory cell included in a second unit cell array that is said specific unit cell array other than said first unit cell array and not accessed at the second time after the passage of a predetermined time from said first time.

9 Claims, 11 Drawing Sheets

Fig. 12

SEMICONDUCTOR MEMORY DEVICE

CROSS-REFERENCE TO RELATED APPLICATION

This application is based upon and claims the benefit of priority from the prior Japanese Patent Application No. 2008-205102, filed on Aug. 8, 2008, the entire contents of which are incorporated herein by reference.

BACKGROUND OF THE INVENTION

1. Field of the Invention

The present invention relates to a nonvolatile semiconductor memory device for nonvolatilely writing data in accordance with application of a voltage to a variable resistive element.

2. Description of the Related Art

As a technology for realizing the microstructure of a memory cell, a resistance variation type memory employing a variable resistive element for the memory cell has been proposed. The variable resistive elements including a phase change memory element that changes the resistance value due to a change in the crystalline or amorphous state of a chalcogenide compound, an MRAM element employing a resistance change due to a tunneling magneto-resistance effect, a memory element of a polymer ferroelectric RAM (PFRAM) in which a resistive element is formed of conducting polymer, and an ReRAM element causing a resistance change by application of an electric pulse are well known (patent document 1: JP-A-2006-344349).

This resistance variation type memory can compose the memory cell of a series circuit of a Schottky diode and a variable resistive element, instead of a transistor, and has an advantage of achieving higher levels of integration with a three dimensional structure because of easy lamination (patent document 2: JP-A-2005-522045).

In the case where the resistance variation type memory is used, it is required to boost the voltage of one wirings (word lines or bit lines) connected to the unselected memory cells, or one wirings connected to all (unselected and selected) memory cells, so that a reverse bias may be applied to the memory cell, before all the operations. With this operation, a parasitic capacitance of the memory cell is charged to generate a charging current.

However, the charging current to the parasitic capacitance is larger as the resistance variation type memory is integrated at higher level. Thereby, a power noise occurs, possibly causing a malfunction.

SUMMARY OF THE INVENTION

A nonvolatile semiconductor memory device having a plurality of unit cell arrays having memory cells each containing a first wiring and a second wiring intersecting each other, and a variable resistive element arranged at each intersection of said first wiring and said second wiring and electrically rewritable to nonvolatilely store a resistance value as data, characterized by comprising: a control circuit for applying a predetermined voltage to said memory cell in selectively accessing said memory cell; wherein said control circuit accumulates a predetermined electric charge in a parasitic capacitance of said memory cell included in a first unit cell array that is said specific unit cell array and not accessed at the first time, while on the other hand, accumulates a predetermined electric charge in a parasitic capacitance of said memory cell included in a second unit cell array that is said specific unit cell array other than said first unit cell array and not accessed at the second time after the passage of a predetermined time from said first time.

DETAILED DESCRIPTION OF THE INVENTION

First Embodiment (Schematic Configuration of Nonvolatile Semiconductor Memory Device According to the First Embodiment)

Figure 1:
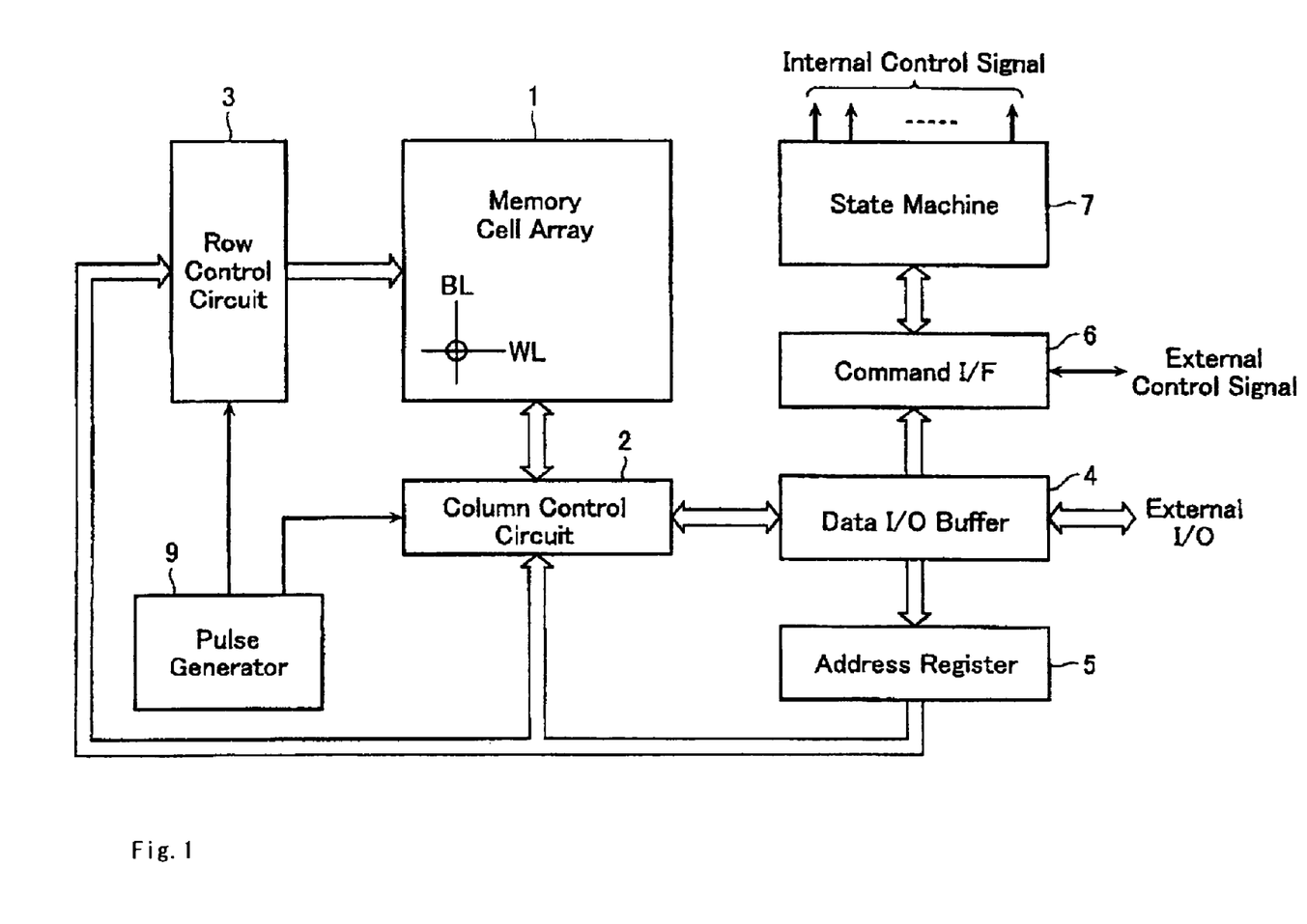
FIG. 1 is a block diagram of a nonvolatile semiconductor memory device according to a first embodiment of the present invention.

Referring to FIG. 1, first of all, the schematic configuration of a nonvolatile semiconductor memory device according to the first embodiment will be described below. FIG. 1 is a block diagram of the nonvolatile semiconductor memory device (nonvolatile memory) according to the first embodiment of the present invention.

This nonvolatile semiconductor memory device comprises a memory cell array 1 in which the memory cells using a variable resistive element are arranged like a matrix. At the position adjacent to the memory cell array 1 in the direction of the bit line BL, a column control circuit 2 for controlling the bit line BL of the memory cell array 1 to erase data from the memory cell, write data into the memory cell and read data from the memory cell is provided. Also, at the position adjacent to the memory cell array 1 in the direction of the word line WL, a row control circuit 3 for selecting the word line WL of the memory cell array 1 and applying a voltage required to erase data from the memory cell, write data into the memory cell and read data from the memory cell is provided.

A data input/output buffer 4 is connected via an I/O line to an external host device, not shown, to receive the write data, receive an erase instruction, output the read data, or receive the address data or command data. The data input/output buffer 4 sends the received write data to the column control circuit 2, and receives the data read from the column control circuit 2 and outputs it to the external. An address supplied to the data input/output buffer 4 from the external is sent via an address register 5 to the column control circuit 2 and the row control circuit 3. Also, a command supplied from the host device to the data input/output buffer 4 is sent to a command interface 6. The command interface 6 receives an external control signal from the host device, judges whether the data inputted into the data input/output buffer 4 is the write data or command or address, and transfers a received command signal to a state machine 7 if the data is the command. The state machine 7 manages the entire nonvolatile semiconductor memory device to receive a command from the host device, read, write, erase and execute data input/output management. Also, the external host device may receive the status information managed by the state machine 7, and judge the operation result. Also, this status information is used for controlling the write and erase.

Also, a pulse generator 9 is controlled by the state machine 7. Under this control, the pulse generator 9 can output a pulse of any voltage at any timing. Herein, the formed pulse can be transferred to any wiring selected by the column control circuit 2 and the row control circuit 3.

The peripheral circuit elements other than the memory cell array 1 can be formed on an Si substrate directly under the memory array 1 formed on a wiring layer, whereby the chip area of this nonvolatile semiconductor memory device can be almost equal to the area of the memory cell array 1.

To put the above configuration in other words, the column control circuit 2 and the row control circuit 3 function as the control circuit for applying a predetermined voltage in the selective access to the memory cell. Herein, the access includes all the operations of set (write), reset (erase) and read (read-out).

(Specific Configuration of Memory Cell Array 1)

Figure 2:
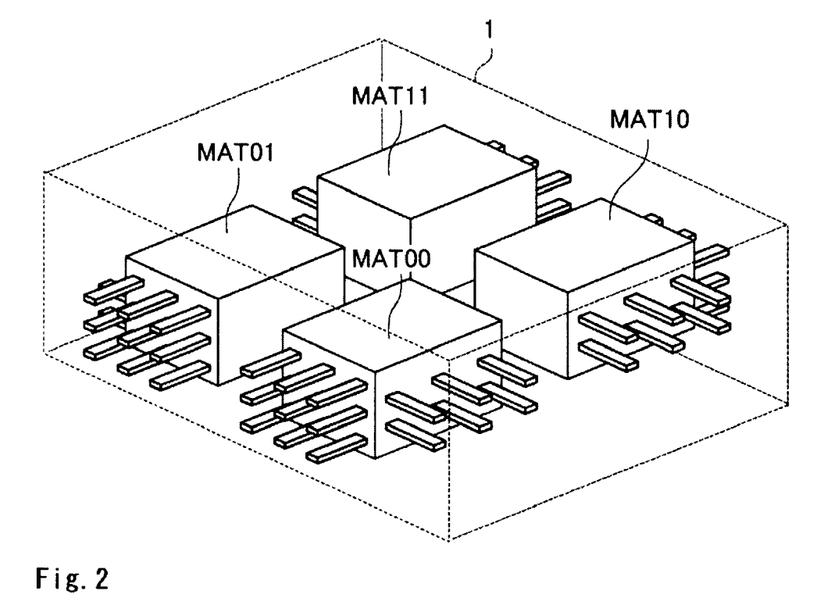
FIG. 2 is a perspective view of a memory cell array 1 according to the first embodiment.
Figure 3:
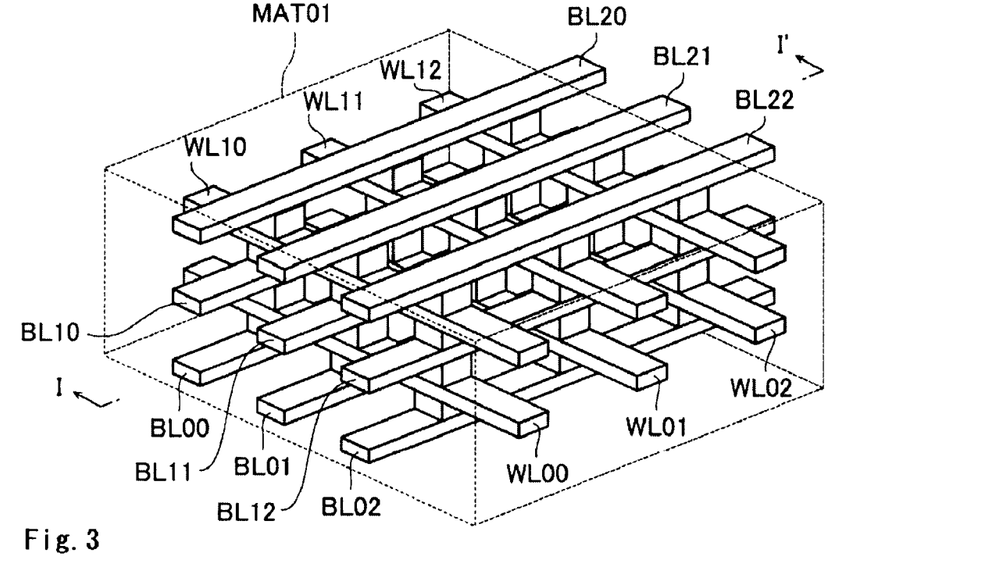
FIG. 3 is a partially enlarged perspective view of the memory cell array 1.
Figure 4:
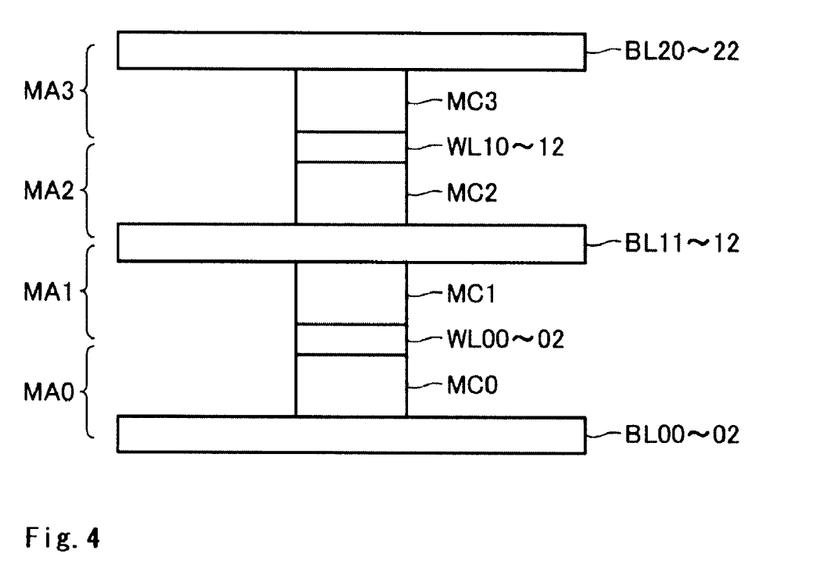
FIG. 4 is a cross-sectional view of a memory cell cut along the line I-I' in FIG. 3, as seen from the direction of the arrow.
Figure 5:
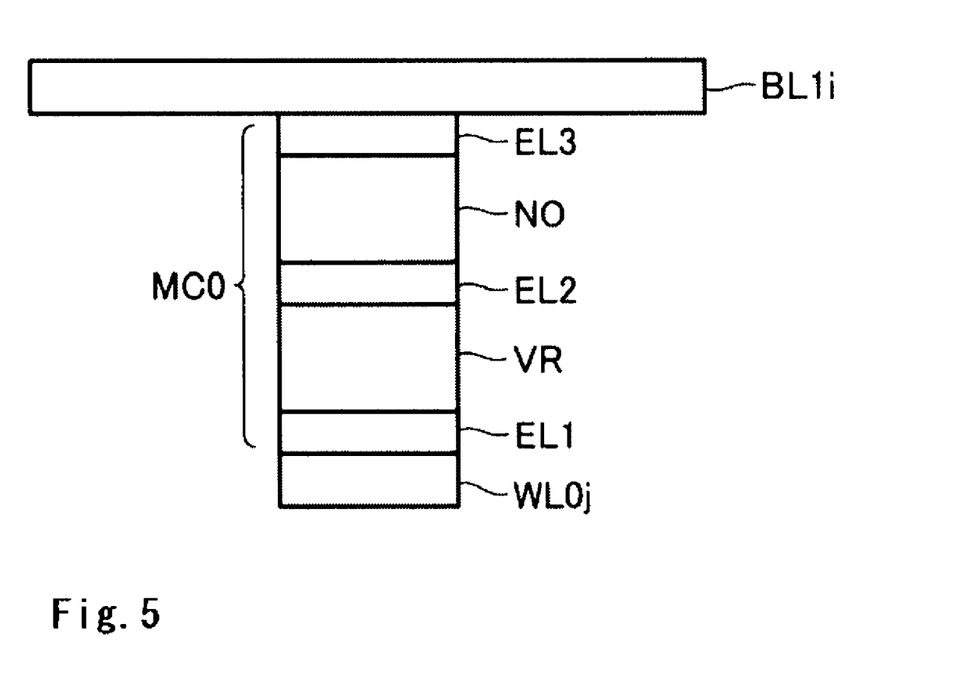
FIG. 5 is an enlarged cross-sectional view of the memory cell MC0 as shown in FIG. 4.
Figure 6:
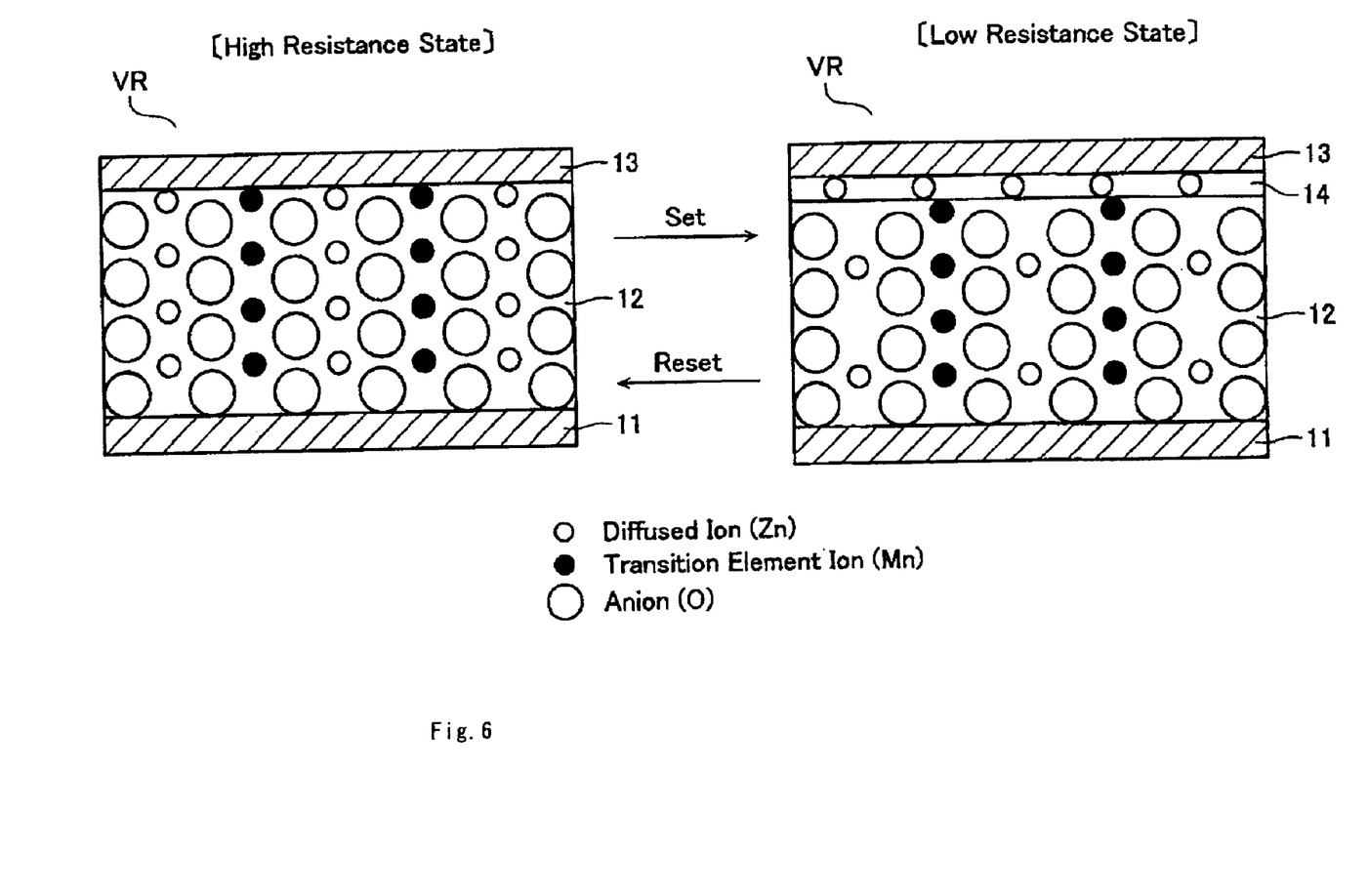
FIG. 6 is a view showing one example of a variable resistive element VR.

Referring mainly to FIGS. 2 to 6, a specific configuration of the memory cell array 1 will be described below. FIG. 2 is a perspective view of the memory cell array 1. FIG. 3 is a partially enlarged perspective view of the memory cell array 1. FIG. 4 is a cross-sectional view of a memory cell cut along the line I-I' in FIG. 3, as seen from the direction of the arrow. FIG. 5 is an enlarged cross-sectional view of the memory cell MC0 as shown in FIG. 4. FIG. 6 is a view showing one example of a variable resistive element VR.

The memory cell array 1 is divided into four unit cell arrays MAT00 to MAT11, for example, as shown in FIG. 2. Each of the unit cell arrays MAT00 to MAT11 has a part of the memory cell array 1. The unit cell arrays MAT00 to MAT11 are arranged like a matrix in the two dimensional direction, as shown in FIG. 2. FIG. 2 is only illustrative, in which the memory cell array 1 may be configured to have the four or more unit cell arrays. Also, the memory cell array 1 is not limited to the configuration in which the unit cell arrays are arranged in the two dimensional direction, but may be the configuration in which the unit cell arrays are laminated in three dimensions.

The unit cell array MAT00 has a lamination structure of four layers composed of laminated memory cell array layers MA0 to MA3, as shown in FIG. 4. The memory cell array layers MA0 to MA3 function as a part of the memory cell array 1. The unit cell array MAT00 is not limited to the lamination structure of four layers, but may have the lamination structure of four or more layers. The unit cell arrays MAT01, MAT10 and MAT11 have the same configuration as the unit cell array MAT00.

The memory cell array layer MA0 is provided with the bit lines BL00 to BL02 as a plurality of first wirings and the word lines WL00 to WL02 as a plurality of second wirings, as shown in FIG. 4. The memory cell array layers MA2 and MA3 have the almost same configuration as the memory cell array layer MA0. The bit lines (first wirings) BL00 to BL22 and the word lines (second wirings) WL00 to WL12 are desirably made of a material strong to heat and having low resistance value, which may be W, WSi, NiSi, or CoSi, for example. The memory cell array layers MA0 to MA3 may have more bit lines BL and word lines WL than the bit lines BL00 to BL22 and the word lines WL00 to WL12.

The bit lines BL00 to BL02 are formed to extend in the first direction at a fixed height. The word lines WL00 to WL02 are formed to extend in the second direction (direction orthogonal to the first direction) at a fixed height between the bit lines BL00 to BL02 and the bit lines BL10 to BL12. The bit lines BL10 to BL12 are formed to extend in the first direction at a fixed height between the word lines WL00 to WL02 and the word lines WL10 to WL12. The word lines WL10 to WL12 are formed to extend in the second direction at a fixed height between the bit lines BL10 to BL12 and the bit lines BL20 to BL22. The bit lines BL20 to BL22 are formed to extend in the first direction at a fixed height on an upper layer of the word lines WL10 to WL12.

That is, the memory cell MC0 is arranged at each intersection of the word lines WL00 to WL02 and the bit lines BL00 to BL02 to be sandwiched between both wirings. The memory cell MC1 is arranged at each intersection of the word lines WL00 to WL02 and the bit lines BL10 to BL12 to be sandwiched between both wirings. The memory cell MC2 is arranged at each intersection of the word lines WL10 to WL12 and the bit lines BL10 to BL12 to be sandwiched between both wirings. The memory cell MC3 is arranged at each intersection of the word lines WL10 to WL12 and the bit lines BL20 to BL22 to be sandwiched between both wirings. The word lines WL00 to WL02 are shared between the upper and lower memory cells MC0 and MC1. Also, the bit lines BL10 to BL12 are shared between the upper and lower memory cells MC1 and MC2, and the word lines WL10 to WL12 are shared between the upper and lower memory cells MC2 and MC3. Also, instead of repeating the wiring and the cell such as wiring/cell/wiring/cell in the above way, an interlayer insulating film may be interposed between the cell array layers, such as wiring/cell/wiring/interlayer insulating film/wiring/cell/wiring.

The memory cell MC0 is composed of a series connection circuit of a variable resistive element VR and a non-ohmic element NO, as shown in FIG. 5. The memory cells MC1 to MC3 have the same configuration as the memory cell MC0.

The variable resistive element VR can change the resistance value due to current, heat or chemical energy by application of a voltage, and has the electrodes EL1 and EL2 acting as a barrier metal and an adhesion layer arranged on the upper and lower sides, as shown in FIG. 5. Examples of the electrode material may include Pt, Au, Ag, TiAlN, SrRuO, Ru, RuN, Ir, Co, Ti, TiN, TaN, LaNiO, Al, PtIrOx, PtRhOx, and Rh/TaAlN. Also, the metals for making the orientation uniform may be inserted. In addition, a buffer layer, a barrier metal layer and an adhesion layer may be inserted.

Available examples of the variable resistive element VR specifically include one that changes the resistance in accordance with a phase change between the crystalline state and the amorphous state, such as a chalcogenide (PCRAM), one that changes the resistance by precipitating metal cations to form a bridge (contacting bridge) between electrodes and ionizing the precipitated metal to destruct the bridge (CBRAM), and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

FIG. 6 is a view showing an example of the ReRAM. The variable resistive element VR as shown in FIG. 6 has a recording layer 12 arranged between the electrode layers 11 and 13. The recording layer 12 is composed of a composite compound containing at least two types of cation elements. At least one of the cation elements is a transition element having the d-orbit incompletely filled with electrons, and the shortest distance between adjacent cation elements is 0.32 nm or less. More specifically, it is represented by a chemical formula $A_xM_yX_z$ (A and M are different elements) and may be formed of material having a crystal structure such as a spiral structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$) and a perovskite structure ($AMO_3$), for example.

In the example of FIG. 6, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions having arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting.

(Circuit Configuration of Unit Cell Array MAT00)

Figure 7:
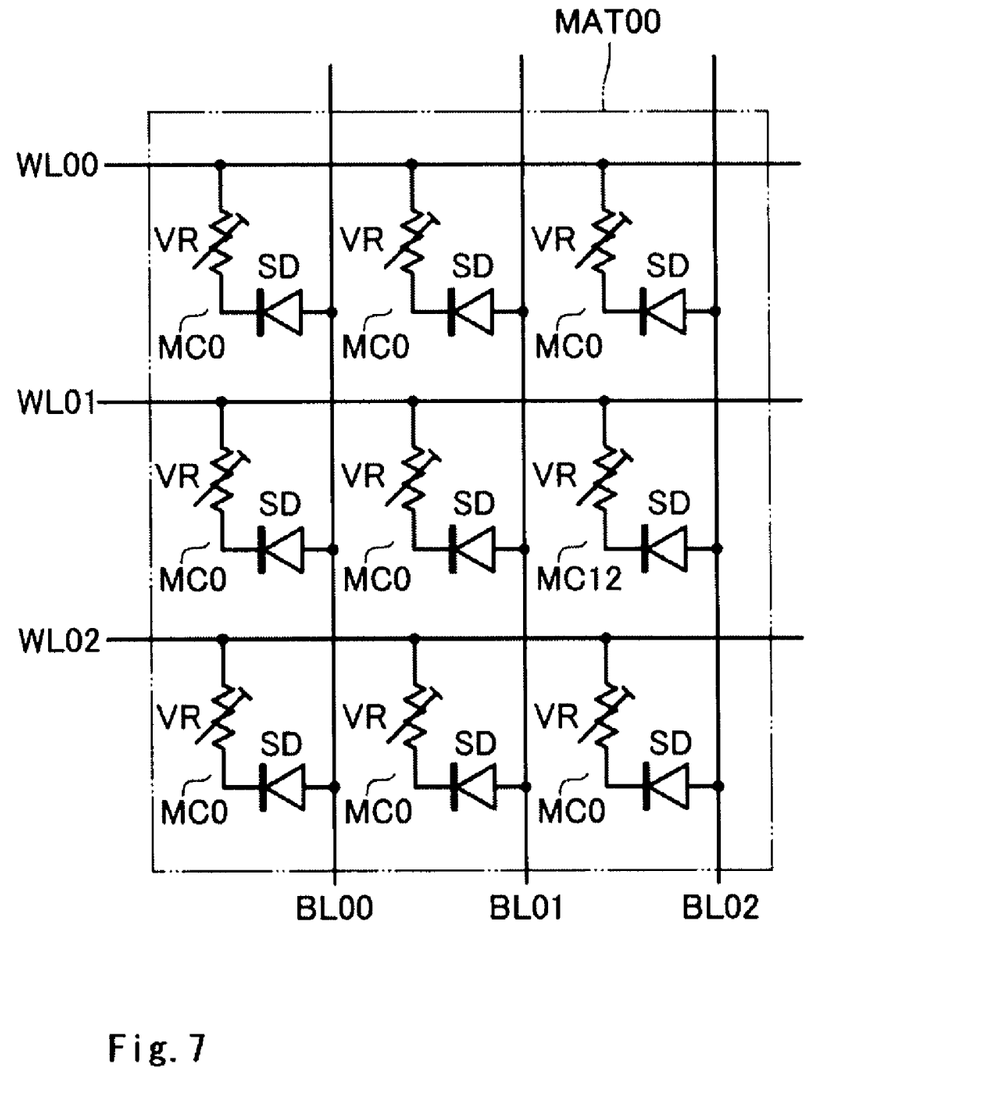
FIG. 7 is a circuit diagram showing a unit cell array MAT00 according to the first embodiment.

Referring to FIG. 7, the circuit configuration of a unit cell array MAT00 in the nonvolatile semiconductor memory device according to the first embodiment will be described below. FIG. 7 is a circuit diagram showing the unit cell array MAT00 in the nonvolatile semiconductor memory device according to the first embodiment. The unit cell arrays MAT01, MAT10 and MAT11 have the same circuit configuration as the unit cell array MAT00.

As described above, the circuit of the unit cell array MAT00 has the configuration as shown in FIG. 7. That is, the circuit of the unit cell array MAT00 has the bit lines BL00 to BL02, the word lines WL00 to WL02, a diode SD (non-ohmic element NO), and a variable resistive element VR. The diode SD and the variable resistive element VR are connected in series, and provided at each intersection of the bit lines BL00 to BL02 and the word lines WL00 to WL02. The anode of the diode SD is connected to the bit lines BL00 to BL02. The cathode of the diode SD is connected to one end of the variable resistive element VR. The other end of the variable resistive element VR is connected to the word lines WL00 to WL02. The diode SD and the variable resistive element VR provided at each intersection of the bit lines BL00 to BL02 and the word lines WL00 to WL02 construct a plurality of memory cells MC0. To put the above configuration in other words, the diode SD is configured to transfer an electric charge in the direction from the bit lines BL00 to BL02 to the word lines WL00 to WL02 at each intersection.

(Write Operation of Nonvolatile Semiconductor Memory Device According to the First Embodiment)

Figure 8:
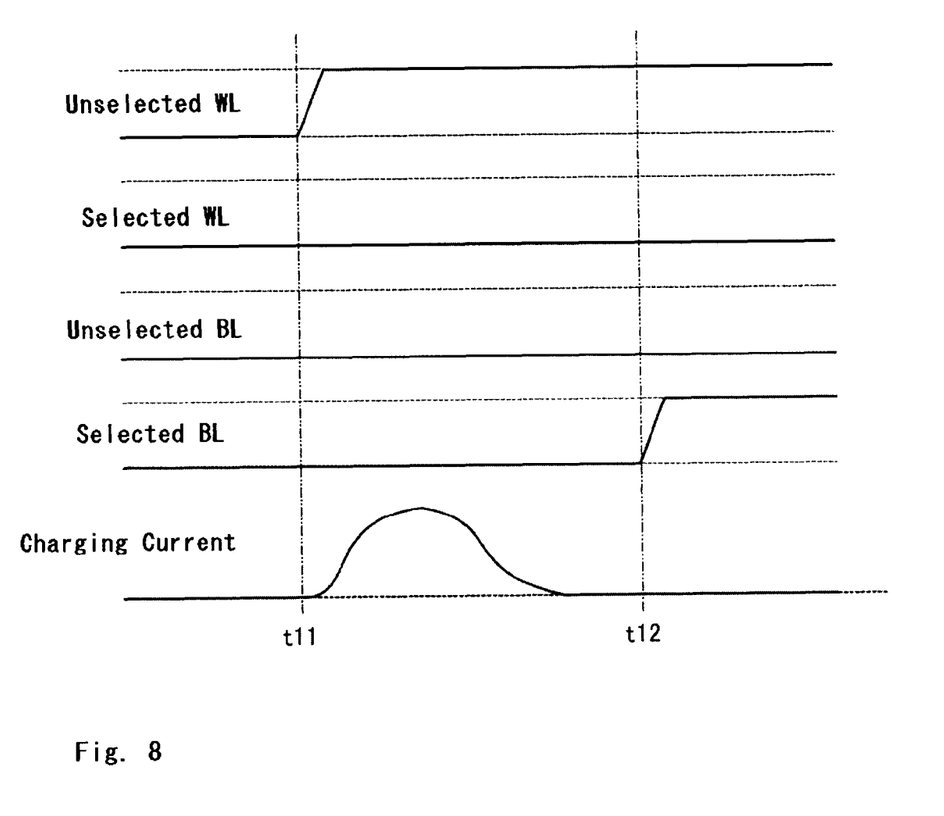
FIG. 8 is a timing chart showing the first write operation of the nonvolatile semiconductor memory device according to the first embodiment.
Figure 9:
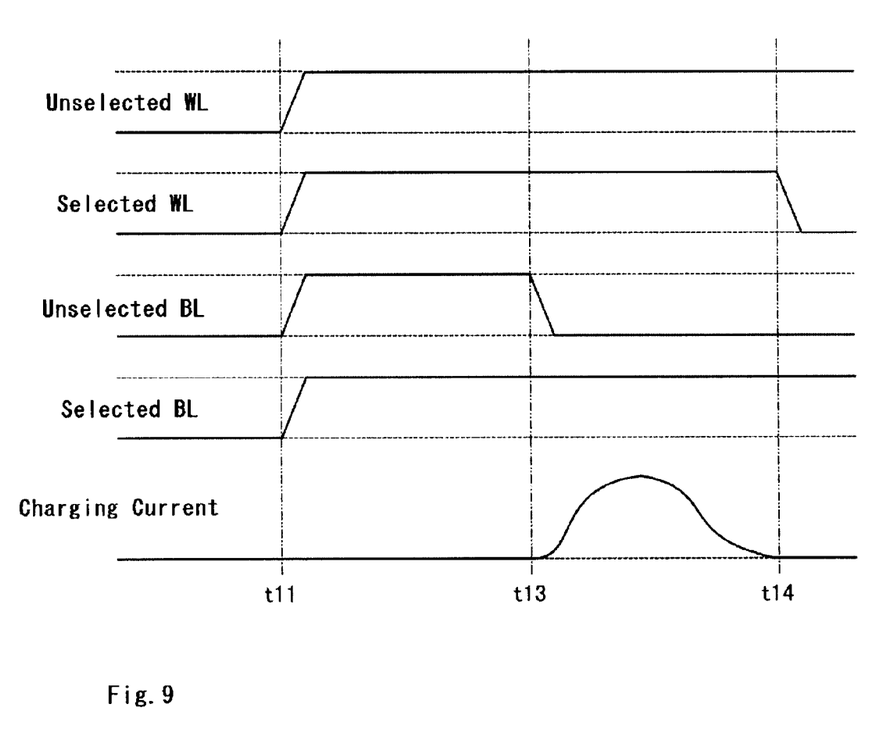
FIG. 9 is a timing chart showing the second write operation of the nonvolatile semiconductor memory device according to the first embodiment.

Referring now to FIGS. 8 and 9, the write operation of the nonvolatile semiconductor memory device according to the first embodiment will be described below. FIG. 8 is a timing chart showing the first write operation, and FIG. 9 is a timing chart showing the second write operation. It is supposed that before the execution of the first write operation and the execution of the second write operation, all of the word lines WL and the bit lines BL are in an "L" state (e.g., 0V). In the following, the bit line BL connected to the memory cell MC to write is referred to as a "selected bit line BL", and the other bit lines BL are referred to as the "unselected bit lines BL". Also, the word line WL connected to the memory cell MC to write is referred to as a "selected word line WL", and the other word lines WL are referred to as the "unselected word lines WL".

The column control circuit 2 and the row control circuit 3 perform the first write operation for a specific unit cell array (first unit cell array). Herein, it is supposed that the objects of the first write operation in the first embodiment are MAT00 and MAT01. Also, the column control circuit 2 and the row control circuit 3 perform the second write operation for a specific unit cell array (second unit cell array). Herein, it is supposed that the objects of the second write operation in the first embodiment are unit cell arrays MAT10 and MAT11.

In the following operation, the column control circuit 2 and the row control circuit 3 (control circuits) accumulate a predetermined charge in the parasitic capacitance of the memory cell MC included in the specific unit cell arrays MAT00 and MAT01 (first unit cell array) and not written (not accessed) at time t11 (first time). Also, the column control circuit 2 and the row control circuit 3 accumulate a predetermined charge in the parasitic capacitance of the memory cell MC included in the specific unit cell arrays MAT10 and MAT11 (second unit cell array) and not written (not accessed) at time t13 (second time) after the passage of a predetermined time from time t11.

Referring firstly to FIG. 8, the first write operation will be described below. In the first write operation, the row control circuit 3 boosts the voltage of the unselected word lines WL from "L" state to "H" state (e.g., 3V) at time t11 (first time), as shown in FIG. 8. Thereby, the memory cells MC included in the unit cell arrays MAT00 and MAT01 and connected to the unselected word lines WL are reversely biased to accumulate the charges in the parasitic capacitances of those memory cells. At this time, a charging current is generated at time t11, as shown in FIG. 8.

Subsequently, the column control circuit 2 boosts the voltage of the selected bit line BL to "H" state at time t12 (third time) after the passage of a predetermined time from time t11. Thereby, the memory cell MC included in the unit cell arrays MAT00 and MAT01 and connected to the selected word line WL and the selected bit line BL is forwardly biased to write data. With the above, the first write operation is ended.

Referring next to FIG. 9, the second write operation will be described below. In the second write operation, the row control circuit 3 boosts the voltage of the selected word line WL and the unselected word lines WL from "L" state to "H" state at time t11, as shown in FIG. 9. Also, the column control circuit 2 boosts the voltage of the selected bit line BL and the unselected bit lines BL from "L" state to "H" state at time t11. Subsequently, the column control circuit 2 steps down the voltage of the unselected bit lines BL from "H" state to "L" state at time t13 (second time) after the passage of a predetermined time from time t11. Thereby, the memory cells MC included in the unit cell arrays MAT10 and MAT11 and connected to the unselected bit lines BL is reversely biased to accumulate the charges in the parasitic capacitances of those memory cells. At this time, a charging current is generated at time t13, as shown in FIG. 9.

Next, the row control circuit 3 steps down the voltage of the selected word line WL from "H" state to "L" state at time t14 (fourth time). Thereby, the memory cell MC connected to the selected word line WL and the selected bit line BL is forwardly biased to write data. With the above, the second write operation is ended.

(Effects of Nonvolatile Semiconductor Memory Device According to the First Embodiment)

Figure 10:
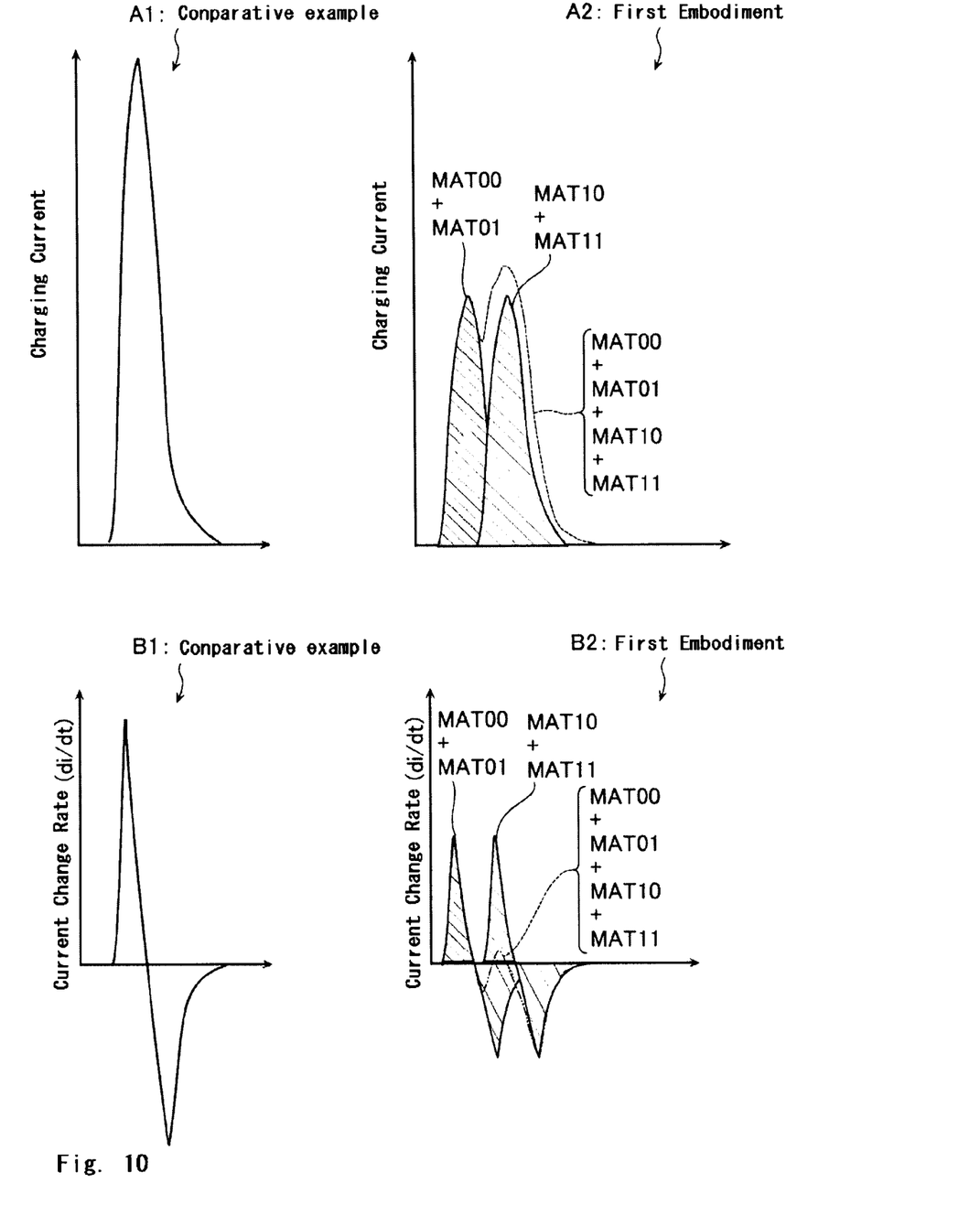
FIG. 10 is a view for explaining the effects of the nonvolatile semiconductor memory device according to the first embodiment.

Referring now to FIG. 10, the effects of the nonvolatile semiconductor memory device according to the first embodiment will be described below. FIG. 10 is a view showing the effects of the nonvolatile semiconductor memory device according to the first embodiment and variations in the charging current in a comparative example.

Herein, it is supposed that the nonvolatile semiconductor memory device in the comparative example starts charging the memory cells included in all the unit cell arrays at a predetermined time simultaneously. On the contrary, the nonvolatile semiconductor memory device according to the first embodiment performs the first write operation for the unit cell arrays MAT00 and MAT01. Also, the nonvolatile semiconductor memory device according to the first embodiment performs the second write operation for the unit cell arrays MAT10 and MAT11.

With the above operation, the nonvolatile semiconductor memory device according to the first embodiment generates a charging current for the unit cell arrays MAT00 and MAT01 at t11. On the other hand, the nonvolatile semiconductor memory device according to the first embodiment generates a charging current for the unit cell arrays MAT10 and MAT11 at t13 after the passage of a predetermined time from time t11. A time interval between time t11 and time t13 is decided in consideration of the parasitic capacitance and the parasitic resistance of the memory cell MC.

In FIG. 10, a figure as indicated by sign "A1" represents a change of the charging current with the passage of time in the comparative example. A figure as indicated by sign "A2" represents a change of the charging current with the passage of time in the nonvolatile semiconductor memory device according to the first embodiment. A figure as indicated by sign "B1" represents a change of the current change rate (di/dt) with the passage of time in the comparative example. A figure as indicated by sign "B2" represents a change of the current change rate (di/dt) with the passage of time in the nonvolatile semiconductor memory device according to the first embodiment.

As described above, the nonvolatile semiconductor memory device according to the first embodiment accumulates the charge in the parasitic capacitance of the memory cell MC by shifting time between the unit cell arrays MAT00, MAT01 and the unit cell arrays MAT10, MAT11. Accordingly, the nonvolatile semiconductor memory device according to the first embodiment can make the maximum value of the charging current lower than in the comparative example, as indicated by sign "A1" and sign "A2" in FIG. 10. Thereby, the nonvolatile semiconductor memory device according to the first embodiment can make the current change rate (di/dt) less variable than in the comparative example, as indicated by sign "B1" and sign "B2" in FIG. 10. That is, the nonvolatile semiconductor memory device according to the first embodiment can make the noise lower than in the comparative example, thereby suppressing the malfunction.

Second Embodiment (Write Operation of Nonvolatile Semiconductor Memory Device According to the Second Embodiment)

Figure 11:
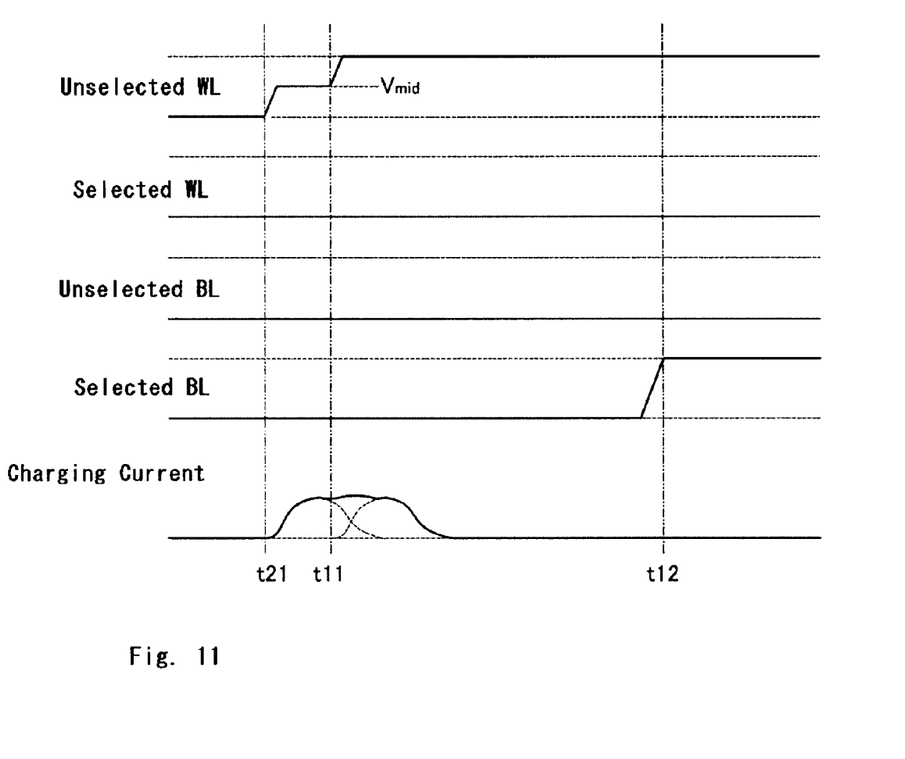
FIG. 11 is a timing chart showing the first write operation of the nonvolatile semiconductor memory device according to the second embodiment.
Figure 12:
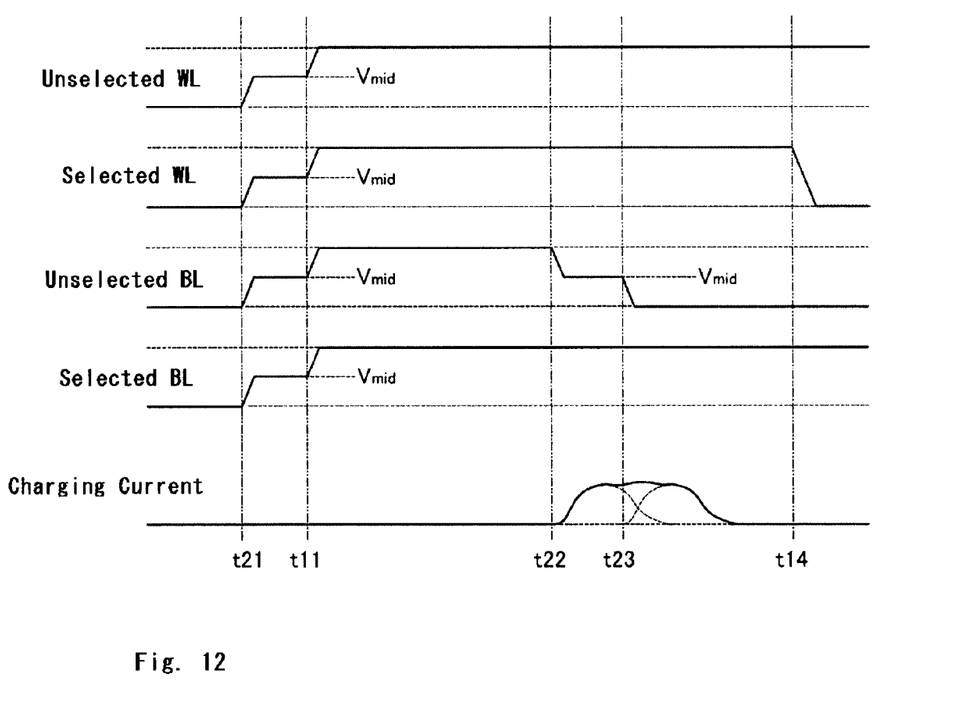
FIG. 12 is a timing chart showing the second write operation of the nonvolatile semiconductor memory according to the second embodiment.

Referring now to FIGS. 11 and 12, the write operation of the nonvolatile semiconductor memory device according to the second embodiment will be described below. The nonvolatile semiconductor memory device according to the second embodiment performs the first write operation and the second write operation that are different from the first embodiment. FIG. 11 is a timing chart showing the first write operation according to the second embodiment. FIG. 12 is a timing chart showing the second write operation according to the second embodiment. In the nonvolatile semiconductor memory device according to the second embodiment, the same parts are designated by the same reference signs as in the first embodiment, and the explanation of the same parts is omitted.

Referring firstly to FIG. 11, the first write operation will be described below. First of all, the row control circuit 3 boosts the voltage of the unselected word lines WL from "L" state to an intermediate potential "Vmid" (e.g., 1.5V) at time t21 ahead of time t11, as shown in FIG. 11. At this time, a charging current corresponding to boosting the voltage of the unselected word lines WL from "L" state to the intermediate potential "Vmid" is generated at time t21, as shown in FIG. 11. The intermediate potential "Vmid" may be a voltage below the threshold value at which the memory cell MC becomes writable (accessible).

Subsequently, the row control circuit 3 boosts the voltage of the unselected word lines WL from the intermediate potential "Vmid" to "H" state at time t11. At this time, a charging current corresponding to boosting the voltage of the unselected word lines WL from the intermediate potential "Vmid" to "H" state is generated at time t11, as shown in FIG. 11.

After time t11, the nonvolatile semiconductor memory device according to the second embodiment performs the same first write operation at time t12 as in the first embodiment.

Referring now to FIG. 12, the second write operation will be described below. First of all, the row control circuit 3 boosts the voltage of the selected word line WL and the unselected word lines WL from "L" state to the intermediate potential "Vmid" (e.g., 1.5V) at time t21 ahead of time t11, as shown in FIG. 12. Also, the column control circuit 2 boosts the voltage of the selected bit line BL and the unselected bit lines BL from "L" state to the intermediate potential "Vmid" at time t21.

Subsequently, the row control circuit 3 boosts the voltage of the selected word line WL and the unselected word lines WL from the intermediate potential "Vmid" to "H" state at time t11. Also, the column control circuit 2 boosts the voltage of the selected bit line BL and the unselected bit lines BL from the intermediate potential "Vmid" to "H" state at time t11.

Next, the column control circuit 2 steps down the voltage of the unselected bit lines BL from "H" state to the intermediate potential "Vmid" at time t22 after the passage of a predetermined time from time t11. At this time, a charging current corresponding to stepping down the voltage of the unselected bit lines BL from "H" state to the intermediate potential "Vmid" is generated at time t22, as shown in FIG. 12.

Subsequently, the column control circuit 2 steps down the voltage of the unselected bit lines BL from the intermediate potential "Vmid" to "L" state at time t23 after the passage of a predetermined time from time t22. At this time, a charging current corresponding to stepping down the voltage of the unselected bit lines BL from the intermediate potential "Vmid" to "L" state is generated at time t23, as shown in FIG. 12.

After time t23, the nonvolatile semiconductor memory device according to the second embodiment performs the same second write operation at time t14 as in the first embodiment.

(Effects of Nonvolatile Semiconductor Memory Device According to the Second Embodiment)

The effects of the nonvolatile semiconductor memory device according to the second embodiment will be described below. As described above, the nonvolatile semiconductor memory device according to the second embodiment has the same configuration and performs the almost same operation as in the first embodiment. Accordingly, the nonvolatile semiconductor memory device according to the second embodiment achieves the same effects as the first embodiment.

The nonvolatile semiconductor memory device according to the second embodiment accumulates the charge in the parasitic capacitance of the memory cell MC at two steps at time t21 and time t11 in the first write operation. Also, the nonvolatile semiconductor memory device according to the second embodiment accumulates the charge in the parasitic capacitance of the memory cell MC at two steps at time t22 and time t23 in the second write operation. Accordingly, the nonvolatile semiconductor memory device according to the second embodiment can generate a charging current more separately over time than the first embodiment. That is, the nonvolatile semiconductor memory device according to the second embodiment can make the noise lower than in the first embodiment, thereby suppressing the malfunction.

Also, the nonvolatile semiconductor memory device according to the second embodiment boosts the voltage of the word lines WL (and the bit lines BL) to "H" state after once boosting the voltage to the intermediate potential Vmid at time t21. Accordingly, the nonvolatile semiconductor memory device according to the second embodiment can perform the write operation faster at time t11 than the first embodiment.

Other Embodiments

Though the first and second embodiments of the nonvolatile semiconductor memory device have been described above, the invention is not limited to the above embodiments, and various changes, additions or substitutions may be made without departing from the spirit or scope of the invention.

For example, the invention is not particularly limited to the structure of the memory cell, but may be also applicable to various multi-layer memories of cross-point type, such as a phase change memory element, MRAM element, PFRAM and RRAM.

What is claimed is:

1. A nonvolatile semiconductor memory device having a plurality of unit cell arrays having memory cells each containing a first wiring and a second wiring intersecting each other, and a variable resistive element arranged at each intersection of said first wiring and said second wiring and electrically rewritable to nonvolatilely store a resistance value as data, characterized by comprising:

a control circuit for applying a predetermined voltage to a memory cell in selectively accessing said memory cell;

wherein said control circuit accumulates a predetermined electric charge in a parasitic capacitance of said memory cell included in a first unit cell array that is a specific unit cell array and not accessed at a first time, while on the other hand, accumulates a predetermined electric charge in a parasitic capacitance of said memory cell included in a second unit cell array that is said specific unit cell array other than said first unit cell array and not accessed at a second time after the passage of a predetermined time from said first time.

2. The nonvolatile semiconductor memory device according to claim 1, characterized in that said memory cell comprises a diode for transferring the electric charge in a direction from said first wiring to said second wiring at said intersection, wherein said control circuit boosts the voltage of said second wiring connected to said memory cell included in said first unit cell array and not accessed and boosts the voltage of said first wiring and said second wiring included in said second unit cell array at said first time, and steps down the voltage of said first wiring connected to said memory cell included in said second unit cell array and not accessed at said second time.

3. The nonvolatile semiconductor memory device according to claim 2, characterized in that said control circuit boosts the voltage of said first wiring connected to said memory cell included in said first unit cell array and accessed at a third time after the passage of a predetermined time from said first time.

4. The nonvolatile semiconductor memory device according to claim 2, characterized in that said control circuit steps down the voltage of said first wiring connected to said memory cell included in said second unit cell array and accessed at a fourth time after the passage of a predetermined time from said second time.

5. The nonvolatile semiconductor memory device according to claim 3, characterized in that said control circuit steps down the voltage of said first wiring connected to said memory cell included in said second unit cell array and accessed at a fourth time after the passage of a predetermined time from said second time.

6. The nonvolatile semiconductor memory device according to claim 1, characterized in that said control circuit applies an intermediate voltage below a threshold value at which it is accessible to said memory cell.

7. The nonvolatile semiconductor memory device according to claim 2, characterized in that said control circuit applies an intermediate voltage below a threshold value at which it is accessible to said memory cell.

8. The nonvolatile semiconductor memory device according to claim 3, characterized in that said control circuit applies an intermediate voltage below a threshold value at which it is accessible to said memory cell.

9. The nonvolatile semiconductor memory device according to claim 4, characterized in that said control circuit applies an intermediate voltage below a threshold value at which it is accessible to said memory cell.

* * * * *